(12) United States Patent
Song

(10) Patent No.: US 8,847,801 B2
(45) Date of Patent: Sep. 30, 2014

(54) CALIBRATION SYSTEMS AND METHODS FOR DIGITAL-TO-ANALOG CONVERTER

(71) Applicant: QUALCOMM Incorporated, San Diego, CA (US)

(72) Inventor: Tongyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/779,122

(22) Filed: Feb. 27, 2013

(65) Prior Publication Data

US 2014/0240152 A1 Aug. 28, 2014

(51) Int. Cl.
*H03M 1/10* (2006.01)

(52) U.S. Cl.
CPC .................................. *H03M 1/1009* (2013.01)
USPC .......................................... 341/120; 341/144

(58) Field of Classification Search
USPC ......................................... 341/120, 118, 144
See application file for complete search history.

(56) References Cited

U.S. PATENT DOCUMENTS

| | | | |
|---|---|---|---|
| 6,642,869 B2 | 11/2003 | Kuyel et al. | |
| 6,707,404 B1 | 3/2004 | Yilmaz | |
| 7,466,252 B1 | 12/2008 | Radulov et al. | |
| 7,969,335 B2 | 6/2011 | Arias et al. | |
| 8,125,361 B2 * | 2/2012 | Choe et al. | 341/120 |
| 8,134,486 B2 * | 3/2012 | Lai et al. | 341/120 |
| 8,179,295 B2 * | 5/2012 | Ho et al. | 341/145 |
| 8,378,863 B2 * | 2/2013 | Ishikawa | 341/118 |
| 2012/0161993 A1 | 6/2012 | Choi et al. | |

FOREIGN PATENT DOCUMENTS

EP 0794535 A2 9/1997

OTHER PUBLICATIONS

Arias, et al., "Nonlinearity Correction for Multibit ? ? DACs," IEEE Transactions on Circuits and Systems-I, Regular Papers, vol. 52, No. 6, Jun. 2005, pp. 1033-1041.
Cong, et al., "A 1.5-V 14-Bit 100-MS/s Self-Calibrated DAC," IEEE Journal of Solid-State Circuits, vol. 38, No. 12, Dec. 2003, pp. 2051-2060.
Mercer, D.A., "Low-Power Approaches to High-Speed Current-Steering Digital-to-Analog Converters in 0.18-μm CMOS," IEEE Journal of Solid-State Circuits, vol. 42, No. 8, Aug. 2007, pp. 1688-1698.
Groeneveld D.W.J., et al., "A Self-Calibration Technique for Monolithic High-Resolution D/A Converters", IEEE Journal of Solid-State Circuits, vol. 24, No. 6, Dec. 1989, pp. 1517-1522, XP000100482.
International Search Report and Written Opinion—PCT/US2014/016170—ISA/EPO—Jun. 12, 2014.

* cited by examiner

*Primary Examiner* — Brian Young
(74) *Attorney, Agent, or Firm* — Patterson & Sheridan, L.L.P.

(57) ABSTRACT

Circuits, methods, non-transitory storage media can be configured to reduce calibration errors in a signal converter. A digital-to-analog converter can include a calibration circuit configured to calibrate a digital-to-analog converter (DAC) bit element using a residual error from a previously calibrated digital-to-analog converter (DAC) bit element. The residual error can be stored in memory.

18 Claims, 12 Drawing Sheets

CALIBRATION SYSTEMS AND METHODS FOR DIGITAL-TO-ANALOG CONVERTER

BACKGROUND

1. Field

Various embodiments disclosed herein relate generally to methods of and systems for digital-to-analog conversion. This disclosure relates to methods of and systems for calibrating a digital-to-analog converter (DAC).

2. Background

DACs are utilized in a wide variety of applications. DACs can be susceptible to various types of errors including but not limited to errors related to current or voltage source mismatches, gain and offset errors, as well as errors caused by external signal paths. To achieve better performance in the areas of signal-to-noise and distortion ratio (SNDR), total harmonic distortion (THD), and spurious free dynamic range (SFDR), self-calibration techniques are utilized to calibrate the output provided by the DAC.

One self-calibration technique employs controllable current sources and a calibration circuit to tune current source values. The calibration circuit compares the current source value provided by a selected controllable current source to a reference current value and adjusts the controllable current source in accordance with the comparison. However, with such conventional self-calibration of current source values, DACs can be susceptible to large integral non-linearity (INL) errors across the bit elements of the DAC, which can result in large DAC performance variations. The large or unbounded INL errors can be due to calibration errors or variations. The calibration errors can be caused by finite calibration resolution, current comparator noise, and other issues.

According to another self-calibration technique, an analog-to-digital converter digitizes most significant bit (MSB) codes at the output of the DAC and compares the MSB codes to expected outputs to obtain errors which are stored for each code. The errors are used to drive the DAC and compensate for the errors. However, this ADC-based self-calibration technique requires an ADC with adequate resolution which significantly adds to the silicon area and power consumption of the DAC.

SUMMARY

An embodiment relates to a method calibrating a multi-element circuit. The method includes storing a first residual error based on a difference between a reference current and a first calibrated current associated with a first element, and comparing the reference current and a second calibrated current associated with a second element using the first residual error.

Another embodiment relates to a digital-to-analog converter. The digital-to-analog converter includes a calibration circuit configured to calibrate a digital-to-analog converter (DAC) element using a residual error from a previously calibrated digital-to-analog converter (DAC) element.

Yet another embodiment relates to an apparatus. The apparatus includes means for providing a reference current and means for providing a first calibrated current in response to a comparison of the reference current and the first calibrated current. The apparatus also includes means for storing a first residual error associated with the first calibrated current and means for providing a second calibrated current in response to a comparison of the reference current and the second calibrated current. The means for providing the second calibrated current uses the first residual error.

Still another embodiment relates to a circuit. The circuit includes a plurality of digital-to-analog conversion bit elements, each bit element has a calibrated current source. The circuit also includes a calibration error reduction circuit that has a first memory circuit. The first memory circuit stores a first residual error associated with a first calibrated current from one of the digital-to-analog conversion bit elements, and the first residual error is used to provide a second calibrated current from another of the digital-to-analog conversion bit elements.

DETAILED DESCRIPTION

Reference throughout this specification to "one example", "one feature", "an example" or "one feature" means that a particular feature, structure, or characteristic described in connection with the feature and/or example may be included in at least one feature and/or example of claimed subject matter. Thus, the appearances of the phrase "in one example", "an example", "in one embodiment", "in one feature" or "a feature" in various places throughout this specification are not necessarily all referring to the same feature and/or example. Furthermore, the particular features, structures, or characteristics may be combined in or with one or more examples and/or features.

Certain embodiments are directed to calibration error reduction methods and circuits. In one embodiment, such a method is used in a digital-to-analog converter (DAC) (e.g., a controlled current source DAC). According to one embodiment, the residual error from the previous calibration is saved and used in the next calibration. In some embodiments, two memory cells are used to save the residual errors, such that a first memory cell is first used to supply the previous residual error and the second memory cell is used to store the current residual error. In the next calibration, the roles of the first memory cell and the second memory cell are reversed according to one embodiment. In one embodiment, the residual errors are determined for each DAC bit element in an array (e.g., a most significant bit array (MSB) array), and the prior residual error is used to calibrate the current element. In one embodiment, the residual errors are residual error currents.

In some embodiments, a calibration method can improve the calibration accuracy and reduce the calibration variations. In some embodiments, the calibration method creates a high static linearity and less performance variations in the DAC. The DAC can be utilized in a variety of applications, including but not limited to DACs used in transmitters, computers, sensors, displays, etc.

Figure 1A:
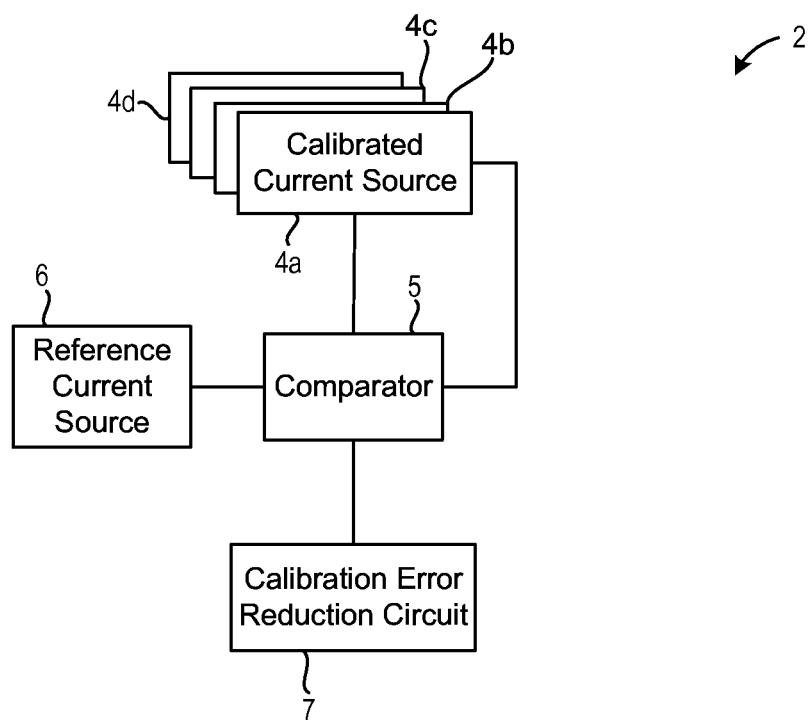
FIG. 1a is a general schematic block diagram of a signal converter including a calibration error reduction circuit in accordance with an exemplary embodiment.

With reference to FIG. 1a, a circuit, such as a signal converter 2, includes multiple circuit elements, such as DAC bit elements. Converter 2 can be a DAC. Each of the elements include a calibrated current source element, such as calibrated current sources 4a-d in one embodiment. Digital signal converter 2 includes a comparator 5, a reference source, such as reference current source 6, and a calibration error reduction circuit 7. In operation, comparator 5 compares a calibrated current from source 4a to a reference current from source 6 to calibrate the calibrated current source 4a in one embodiment. Each calibrated source 4a-d can be calibrated using comparator 5 and reference source 6 in one embodiment.

Calibration error reduction circuit 7 is coupled to comparator 5 and applies a residual error current from a prior calibrated bit element when one of a calibrated current sources 4a-d is being calibrated in one embodiment. Calibration error reduction circuit 7 also samples and stores the current residual error current once the one of current sources 4a-d is calibrated for use in the calibration of the next bit element in one embodiment. Calibration error reduction circuit 7 can improve calibration of calibrated current sources 4a-d of a digital-to-analog converter (DAC). Applying the previous current residual error advantageously creates a bounded integral nonlinearity (INL) error as opposed to an unbounded INL error in one embodiment as described below. Although described below for use in a DAC in one embodiment, calibration reduction circuit 7 can be utilized to reduce calibration errors in other devices or circuits. The calibration operation can be performed during the operation of the device, at device start-up, during device test, during device fabrication, etc.

Figure 1B:
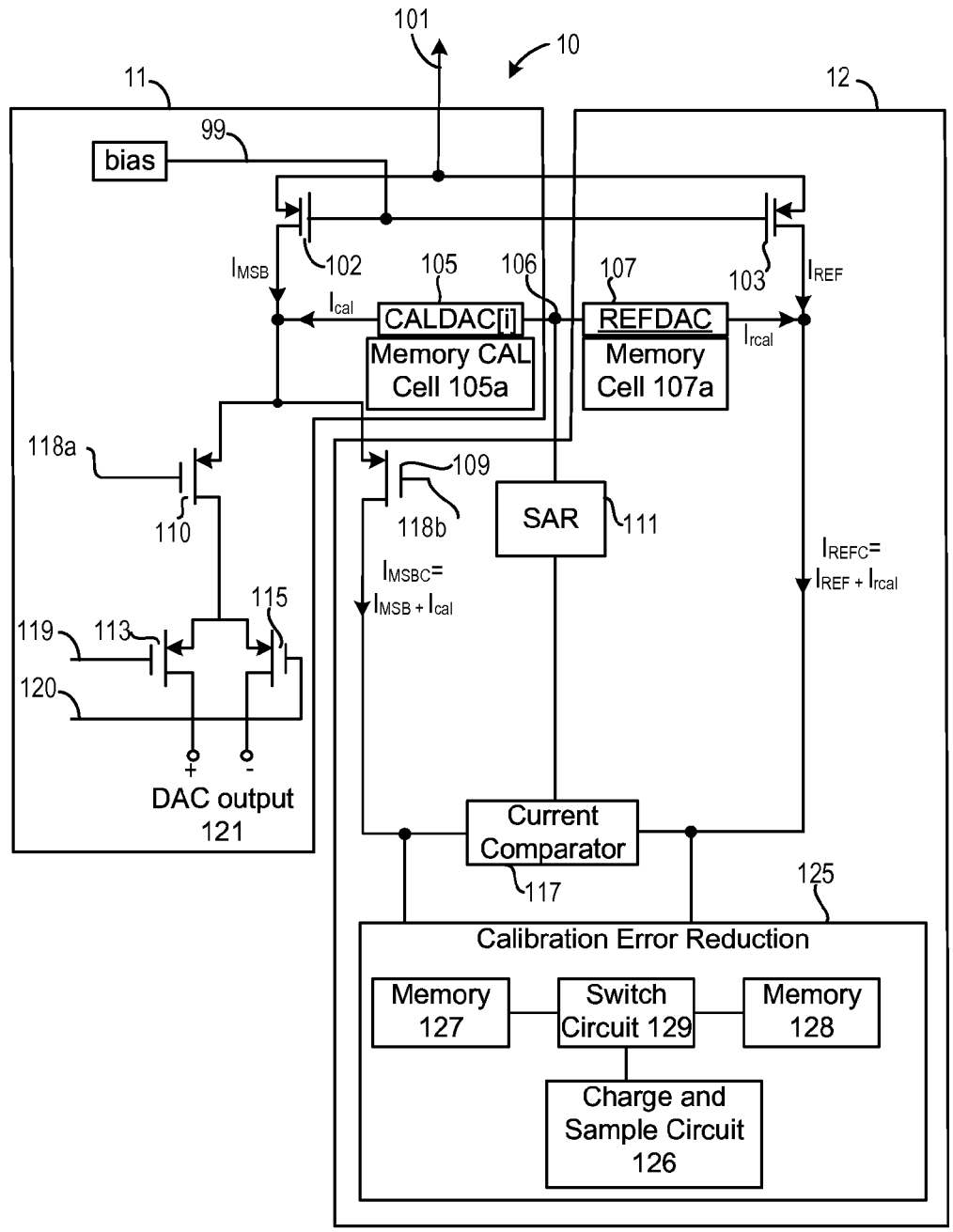
FIG. 1b is a more detailed schematic block diagram of a digital-to-analog converter (DAC) including a calibration error reduction circuit in accordance with another exemplary embodiment.

With reference to FIG. 1b, a DAC 10 is comprised of one or more DAC bit elements or circuits 11 and a calibration circuit 12. Although only one circuit 11 is shown in FIG. 1b, it is understood that DAC 10 can include multiple circuits 11 (e.g., one circuit 11 for each bit or MSB of the DAC in one embodiment). In one embodiment, DAC 10 is a controlled current source DAC.

In one embodiment, DAC bit circuit 11 includes a transistor 102, a calibration digital-to-analog converter (DAC) 105 coupled to a node 106, a transistor 110, a transistor 113, a transistor 115, and differential DAC output lines 121. Transistor 102 provides current $I_{mb}$ and calibration DAC 105 provides current $I_{cal}$ to calibrate the current provided at output lines 121. When in an operational mode, transistor 110 allows current $I_{msbc}$ ($I_{msb}+I_{cal}$) to reach transistors 113 and 115. Transistors 113 and 115 are controlled at gates 119 and 115, respectively, by a bit control signal for the bit associated with circuit 11 (e.g., $MSB_i$). Calibration DAC 105 provides current $I_{cal}$ so that current $I_{msbc}$ ($I_{mb}+I_{cal}$) matches a predetermined reference current $I_{REFC}$ (e.g., $I_{REF}+I_{rcal}$).

In one embodiment, circuit 11 operates as a controllable current source controlled at least in part by the a calibration value stored in calibration memory cell 105a. The calibration value can be digital data provided at node 106 by calibration circuit 12. Although specific exemplary components and arrangements are shown in FIG. 1b for circuit 11, they are not shown in a limiting fashion. DAC 10 can use any type of bit element circuits.

In one embodiment, calibration circuit 12 includes a transistor 103 coupled to a power node 101, a reference calibration DAC 107, a transistor 109, a successive approximation register (SAR) 111, a current comparator 117, and a calibration error reduction circuit 125. Transistor 103 provides current $I_{REF}$ and calibration DAC 105 provides a current $I_{rcal}$. Reference DAC 107 operates similarly to calibration DAC 105 and provides current $I_{rcal}$ in response to a calibration value stored in memory 107a. DAC 10 can include separate calibration circuits 12 for each DAC circuit 11, share calibration circuit 12 among all or several circuits 11, or share certain components of calibration circuit 12 among multiple circuits 11.

When in a calibration mode, transistor 109 is opened via gate 118b and transistor 109a is closed via gate 118 and current $I_{msbc}$ ($I_{msb}+I_{cal}$) is compared to current $I_{REFC}$ in comparator 177 according to one embodiment. Transistor 102 provides current (e.g., $I_{msbc}$) and transistor 103 provides current $I_{REF}$ in response to a bias signal (e.g., node 99) at respective gates. The calibration value for calibration DAC 105 may be determined in response to current comparator 117 and successive approximation register 111. In one embodiment, current comparator 117 compares the currents $I_{msbc}$ ($I_{msb}+I_{cal}$) and $I_{REFc}$ ($I_{REF}+I_{rcal}$) and adjusts the calibration value via register 111 for calibration DAC 105 until the sums are equal. In one embodiment, the calibration value can be stored in memory cell 105a.

Although specific exemplary components and arrangements are shown in FIG. 1b, they are not shown in a limiting fashion. DAC 10 can use other circuit arrangements for comparing currents and adjusting the currents until the bit element current is equal or appropriately related to the reference current.

In one embodiment, DAC 10 includes a calibration error reduction circuit 125 which includes a charge and sample circuit 126, a first memory 127, a second memory 128, and a switch circuit 129. Charge and sample circuit 126 effects storage of residual errors in memories 127 and 128. Calibration error reduction circuit 125 advantageously reduces INL errors by using the previous residual error in the calibration of circuit 11. Memories 127 and 128 serve to apply the previous residual error and store the current residual error during calibration. Residual errors can be determined or sensed using current mirrors, comparators or other sensing circuits. Switch circuit 129 provides appropriate connections among memories 127 and 128, charge and sample circuit 126 and current comparator 117 to ensure appropriate application and storage of residual errors. Exemplary operations associated with calibration error reduction circuit 125 is discussed below.

A process 30 can be implemented by signal converter 2 or DAC 10 according to one embodiment. Process 30 begins at a step 32 and stores the residual error for the element. The residual error can be equal to the difference between the reference current $I_{REFC}$ for the element and the calibrated current $I_{msb}$ for the element (after calibration). At a step 34, the reference current is compared to a calibrated current for the next element using the residual error. In this way, the calibrated current for the next element is determined using the stored residual error from step 32, thereby binding the INL error as explained below with reference to FIG. 1*d* according to one embodiment.

Process 30 can continue with similar steps to 32 and 34 as residual errors are stored and currents are compared for succeeding elements. For example, the residual error for the next element is determined and stored in a step similar to step 32 and that residual error is used when comparing the reference current to the calibrated current for the element following the next element. Process 30 can continue using the residual error from the preceding element when the reference current is compared to the calibrated current for an element until all elements are calibrated in one embodiment.

Figure 1C:
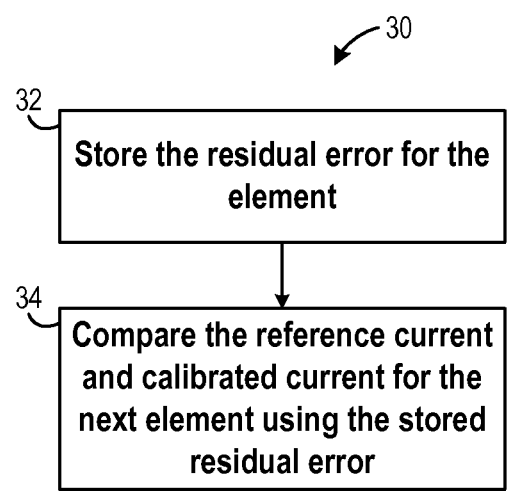
FIG. 1c is a flow chart of a calibration process according to an exemplary embodiment.
Figure 1D:
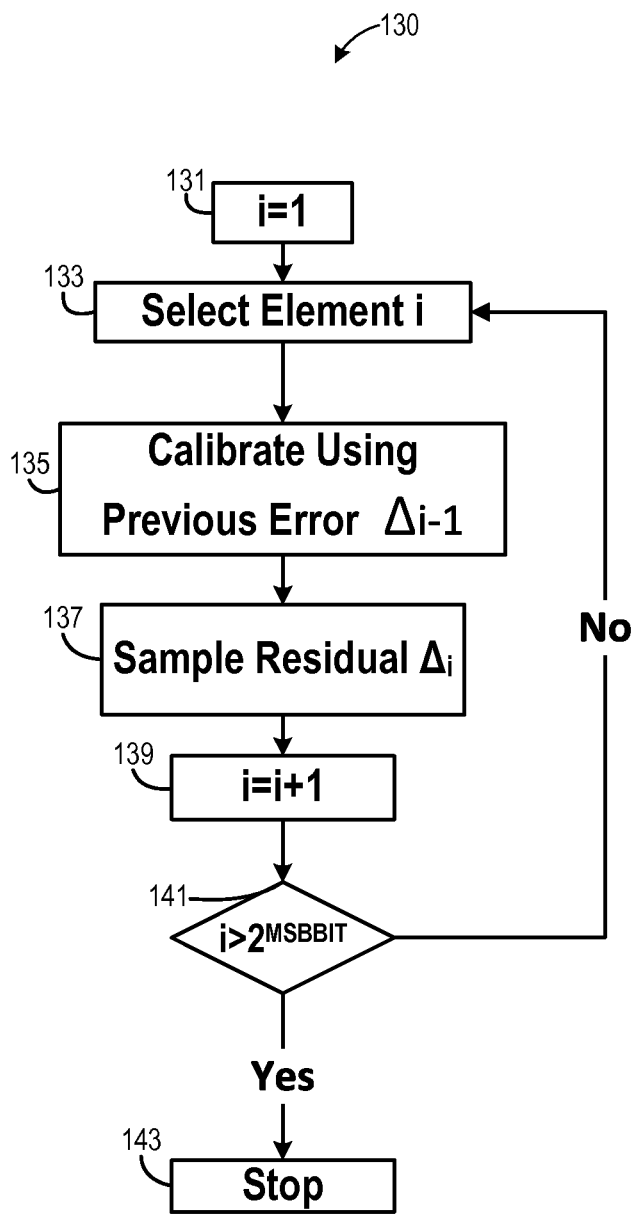
FIG. 1d is a flow chart of a calibration process according to another exemplary embodiment.

With reference to FIG. 1*d*, a process 130 can be implemented by DAC 2 or DAC 10 according to one embodiment. Process 130 begins at a step 131 by setting i=1, and at step 133 by selecting a first element to be calibrated. In one embodiment, the first element can be the element before circuit 11 (e.g. circuit 11 associated with i=2) in a MSB array. At step 135, the current of the first element is added with the previous residual error (e.g., $\Delta_0$) which may be zero or a known value in one embodiment. The previous residual error (e.g., $\Delta_0$) may be stored in memory 128. At a step 135, the first element is calibrated by comparing its calibrated current $I_{msbc}$ (e.g., $I_{msb}+I_{cal}$) with reference current $T_{REFc}$ (e.g., $I_{REF}+I_{rcal}$) and increasing the current $I_{cal}$ until the calibrated current $I_{msbc}$ (e.g., $I_{msb}+I_{cal}$) plus the previous residual error equals (e.g., $\Delta_0$) provided by memory 128 equals the reference current (e.g., $I_{REF}+I_{rcal}$). In one embodiment, calibration is performed by calibration circuit 12 as described above with reference to FIG. 1*b*.

At a step 137, the calibration value associated with $I_{cal}$ is stored and the residual error $\Delta_1$ is sampled and stored. The residual error $\Delta_1$ is sampled and stored by calibration error reduction circuit 125. In one embodiment, residual error $\Delta_1$ is stored in memory 127. Although the current $I_{cal}$ is adjusted during calibration until current $I_{msbc}$ (e.g., $I_{msb}+I_{cal}$) equals reference current $I_{REFc}$ (e.g., $I_{REF}+I_{rcal}$), there exists residual error $\Delta_1$ due to comparator noise, finite calibration resolution, and other issues.

At step 139, the next bit element that will be calibrated is determined by incrementing i by 1 (i=i+1). At step 141, a condition is checked to determine when to stop calibration. The condition being when i is greater than $2^{MSB}$. When the result of the condition is yes, the calibration technique is stopped.

As long as the condition is not met, process 130 continues and process 130 returns to step 131 with a new i. Steps 133 and 135 are repeated using the residual error $\Delta_1$ in memory 127 for calibrating bit element 2 (e.g., circuit 11 in one embodiment). The residual error $\Delta_2$ associated with step 137 is stored in memory 128 and process 130 proceeds according to steps 139 and 141. The order of steps and the sequence of i values in process 130 can be adjusted according to alternative embodiments.

Process 130 can be represented by equations as shown below where $I_0$ corresponds to the reference current $I_{REFc}$ (e.g., $I_{REF}+I_{rcal}$), $I_1$ corresponds to $I_{msbc}$ for bit element 1, $I_2$ corresponds to $I_{msbc}$ for bit element 2, and $I_n$ corresponds to $I_{msbc}$ ($I_{msb}+I_{cal}$) for bit element n according to one embodiment. After calibration, the current $I_t$ is equal to the sum of reference current ($I_0$) and the calibration error (residual error $\Delta_1$) of the calibrated element, as shown below in Equation 1.

$$I_1 = I_0 + \Delta_1 \quad \text{Equation 1:}$$

For the next MSB element, the calibration is performed using the previous calibration error (residual error $\Delta_1$) added to $I_2$. Accordingly after calibration, the current $I_2$ is represented by equations by equations 2 and 3.

$$I_2 + \Delta_1 = I_0 + \Delta_2 \quad \text{Equation 2:}$$

$$I_2 = I_0 + \Delta_2 - \Delta_1 \quad \text{Equation 3:}$$

After subtracting $\Delta_2$ from both sides of equation 2, the result is equation 3. Equation 3 represents the current $I_2$ which equals the reference current combined with the error for the current calibration error reduced by the calibration error of the previous MSB element. Similarly, current in the other MSB elements are represented as follows.

$$I_3 = I_0 + \Delta_3 - \Delta_2 \quad \text{Equation 4}$$
$$I_4 = I_0 + \Delta_4 - \Delta_3$$
$$I_5 = I_0 + \Delta_5 - \Delta_4$$
$$I_6 = I_0 + \Delta_6 - \Delta_5$$
$$\ldots$$
$$I_{64} = I_0 + \Delta_{64} - \Delta_{63} \quad \text{Equation 5}$$

Equation 4 represents the current calculation of the $3^{rd}$ bit element. Equation 5 represents the current calculation for the 64 element. Equation 6 shown below represents the current calculation of the $n^{th}$ MSB.

$$I_n = I_0 + \Delta_n - \Delta_{n-1} \quad \text{Equation 6:}$$

After the calibration, the DNL/INL errors for the DAC are represented by the following equations 7 and 8.

$$DNL: \Delta_1, \Delta_2 - \Delta_1, \Delta_3 - \Delta_2, \ldots, \Delta_{64} - \Delta_{63} \quad \text{Equation 7:}$$

$$INL: \Delta_1, \Delta_2, \Delta_3, \Delta_4, \Delta_5 \ldots \Delta_{64} \quad \text{Equation 8:}$$

Accordingly, in one embodiment, the INL error is bounded, instead of being a running sum, thus reducing the calibration variations. According to some embodiments, the INL error is bounded because the INL error is calculated based on two values (current element error minus the previous current element error) for each element. When the INL is bounded in accordance with one embodiment, it is much smaller than the running sum of Equation 9 below.

$$\sum_{k=1}^{64} \Delta_k \quad \text{Equation 9}$$

FIGS. 2-9 illustrate some example embodiments of a calibration error reduction circuit 225 that is configured to implement process 130 discussed with reference to FIGS. 1*c* and *d* and the above described equations for DAC bit element 230*a* and 230*b*. FIGS. 2-9 display various circuit elements that may include two memory cells and one or more charging circuits, one or more MSB DAC elements. FIGS. 2-8 illustrate one example method of manipulating the circuits to achieve the above equations, other suitable circuits may be utilized to achieve the results of the equations above.

Figure 2:
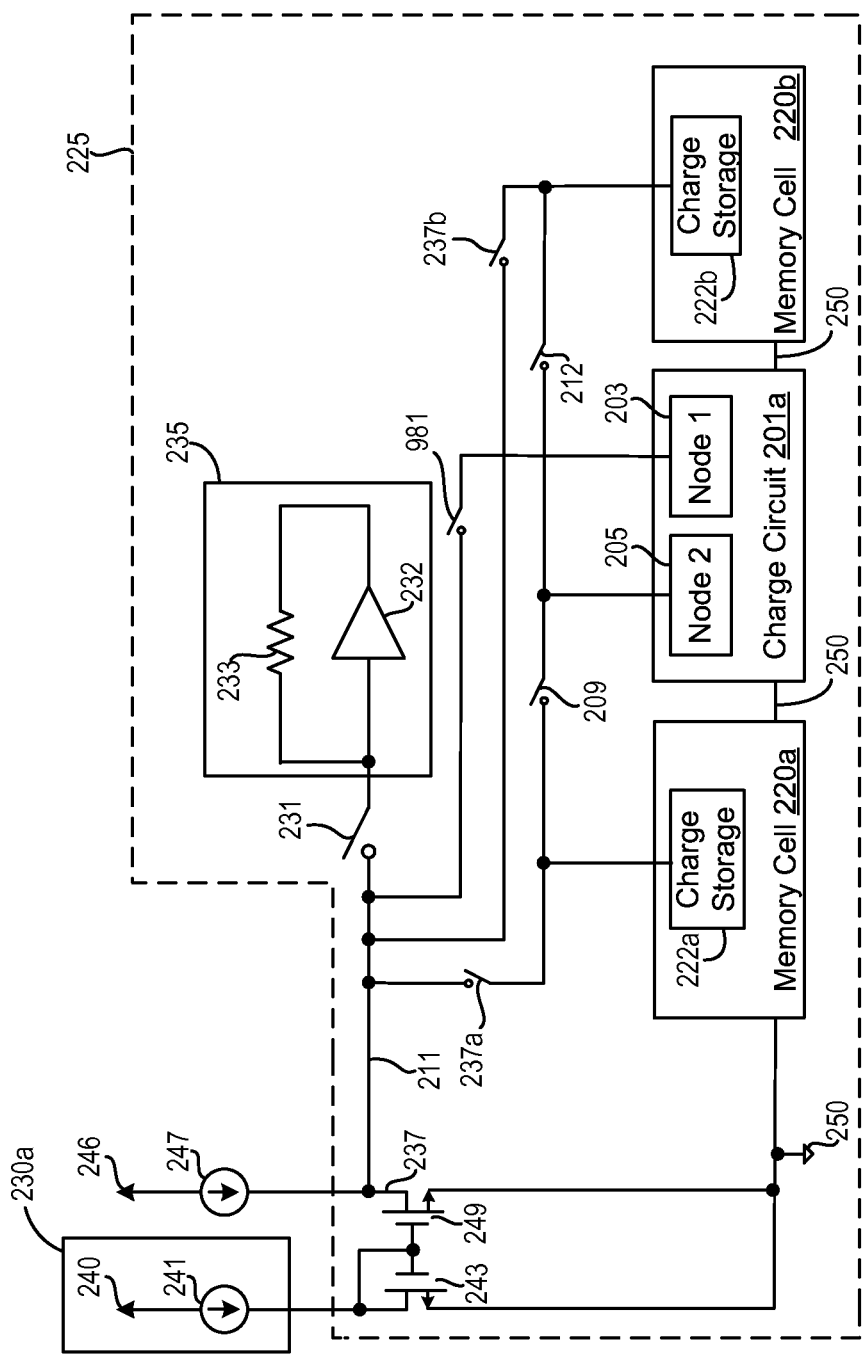
FIG. 2 is an electrical schematic circuit diagram of a calibration error correction circuit for use with a DAC bit element according to another exemplary embodiment.

With reference to FIG. 2, calibration error reduction circuit 225 includes a charge circuit 201*a*, a current comparator 235, a memory cell 220*a*, a transistor 243, a transistor 249, and a memory cell 220b. Circuit 225 can be connected to DAC bit element 230a which includes a calibrated current source 241 coupled to VDD node 240. DAC bit element 230a can be similar to circuit 11 (FIG. 1b) or source 4a (FIG. 1a). Circuit 225 can also be coupled to a reference current source 247 coupled to VDD node 246. Current source 241 can provide current $I_{msbc}$ or $I_{msb}+I_{cal}$ and current source 247 can provide current $I_{REF}$, or $I_{REFC}$ ($I_{REF}+I_{rcal}$). Current comparator 235 can be comprised of an operational amplifier 232 having a resistor 233 coupled between an input and an output of amplifier 232. Circuit 225 can be coupled to succeeding bit elements (e.g., DAC bit element 230b (FIG. 7) to effect the calibration operation for each succeeding bit element as described below.

Transistors 243 and 249 are coupled between sources 241 and 247, respectively, and a ground node 250 during calibration in one embodiment. The gates of transistors 243 and 249 are coupled together and to source 241 according to a current mirror relationship. In one embodiment, charge circuit 201a may be variously connected to one or more of a node 211, memory cell 220b, memory cell 220a, and/or current comparator 235 during the calibration operations as explained below to effect residual error sampling and storing operations. Although shown as part of circuit 225, transistors 243 and 249 and current comparator 235 can be apart of other circuits in the DAC associated with bit element 230a or other circuits according to other embodiments. Comparator 235 can be similar to comparator 5 or 117 discussed with reference to FIGS. 1a and 1b. In one embodiment, succeeding bit elements can each be coupled to transistor 243 to effect residual error sampling and storing operations for each succeeding bit element. Alternatively, each succeeding bit element can include its own transistor 243, 249, and source 247 and be coupled selectively to node 211. According to a further alternative, each succeeding bit element include its own charge circuit 201a and/or comparator 235 and be selectively coupled to memory cells 220a and 220b in accordance with the operations described below.

Switches 237a, 237b, 209, 212, 231, and 981 are solid state switches which operate to interconnect cells 220a and 220b, nodes 203, 205 and 211 and comparator 235 in one embodiment. Switches 237a, 237b, 231 209 and 212 can be controlled by a control circuit or controller. For simplification of FIGS. 3-9, switches 237a, 237b, 209, 212, 231, and 981 as well as amplifier 235 may not be shown in the FIGS. 3-9 when not relevant to the particular operation being described. Switches 237a, 237b, 212, and 209 can be used to exchange the placement of memory cells 220a and 220b as shown in FIGS. 3-9 to effect the storage and sampling operations described below in one embodiment.

Figure 3:
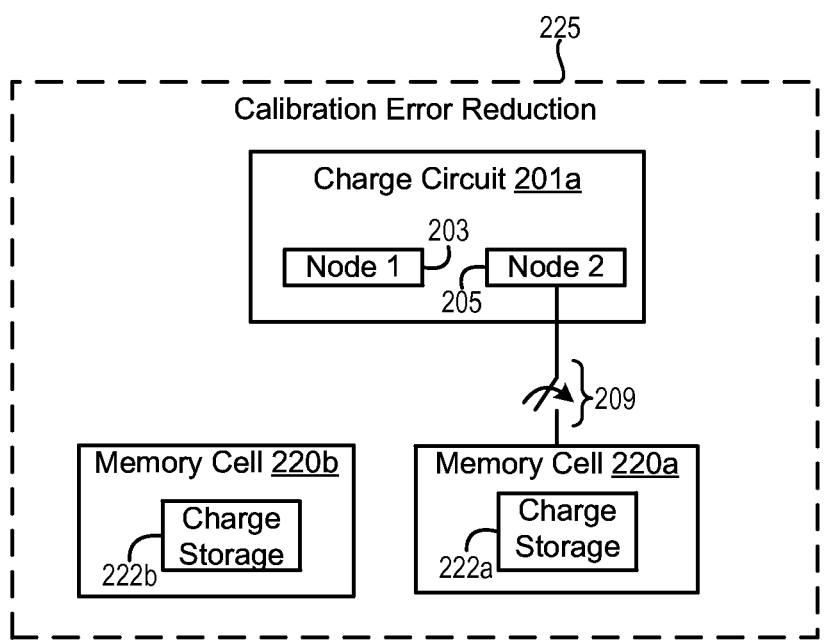
FIG. 3 is a schematic circuit diagram of the calibration error reduction circuit illustrated in FIG. 2 in a storage operation according to another exemplary embodiment.

With reference to FIG. 3, before calibration of current source 241 of bit element 230a (FIG. 2), memory cell 220a is used to store a base current or the current comparator offset current ($I_b$) associated with current comparator 235, as shown in the FIG. 2. The current $I_b$ can be a known fixed value or can be sampled from comparator 235. In one embodiment, the current $I_b$ can be included in $I_{rcal}$ or otherwise accounted for in $I_{REF}$ or $I_{REFC}$.

Charge circuit 201a includes a node 203 and a node 205 in one embodiment. In an example embodiment, node 205 provides current $I_b$ that is provided to memory cell 220a via switch 209. Memory cell 220a includes a charge storage 222a for storing a value associated with current $I_b$ such that memory cell 220a is configured to sink a current corresponding to the current $I_b$. In one embodiment, charge storage 222a may be a capacitor or other suitable charge storage device.

Figure 4:
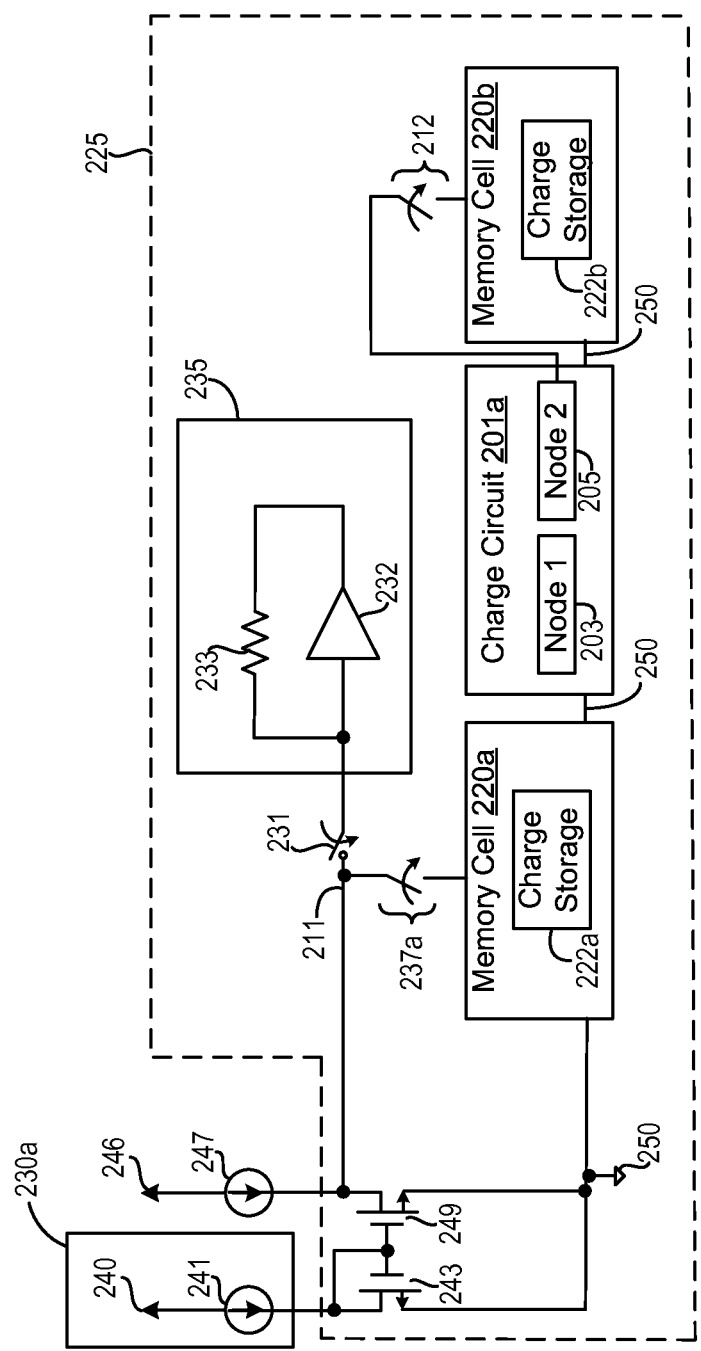
FIG. 4 is a schematic circuit diagram of the calibration error reduction circuit illustrated in FIG. 2 in a calibration operation according to another exemplary embodiment.

With reference to FIG. 4, after current $I_b$ is stored in memory cell 220a, charge circuit 201a is disconnected from memory cell 220a via switch 209. During calibration of source 241, memory cell 220a is connected to node 211 at the input of comparator 235 to apply the stored current (e.g., current $I_b$) for calibration of source 241. Memory cell 220a is connected to the input of comparator 235 by closing the switch 237a and switch 231 in one embodiment. The current $I_b$ is equal to the offset current of comparator 235 so the effect of the offset current on the comparison is cancelled. However, even after cancelling the offset current, a residual current (e.g. delta) may remain on node 211 after calibration of source 241. Memory cell 220b can be connected to charge circuit 201a by switch 212 while the comparator 235 is performing the comparison operation in one embodiment. After the circuit in FIG. 4 has completed its operations described above, the next step may include the steps from FIG. 6, in one embodiment.

Figure 5:
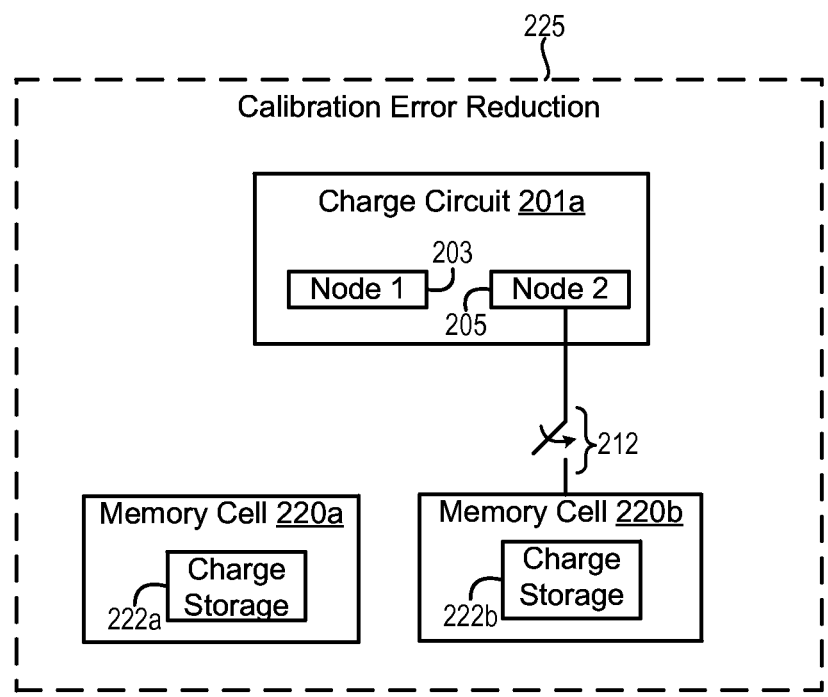
FIG. 5 is a schematic circuit diagram of the calibration error reduction circuit illustrated in FIG. 2 in a storage operation according to another exemplary embodiment.

With reference to FIG. 5, node 205 of charge circuit 201a is connected to memory cell 220b to store the offset current $I_b$. A switch 212 can be used to connect node 205 to memory cell 220b. In one embodiment, the circuit operation in FIG. 5 can be performed with the circuit operation described in FIG. 4.

Figure 6:
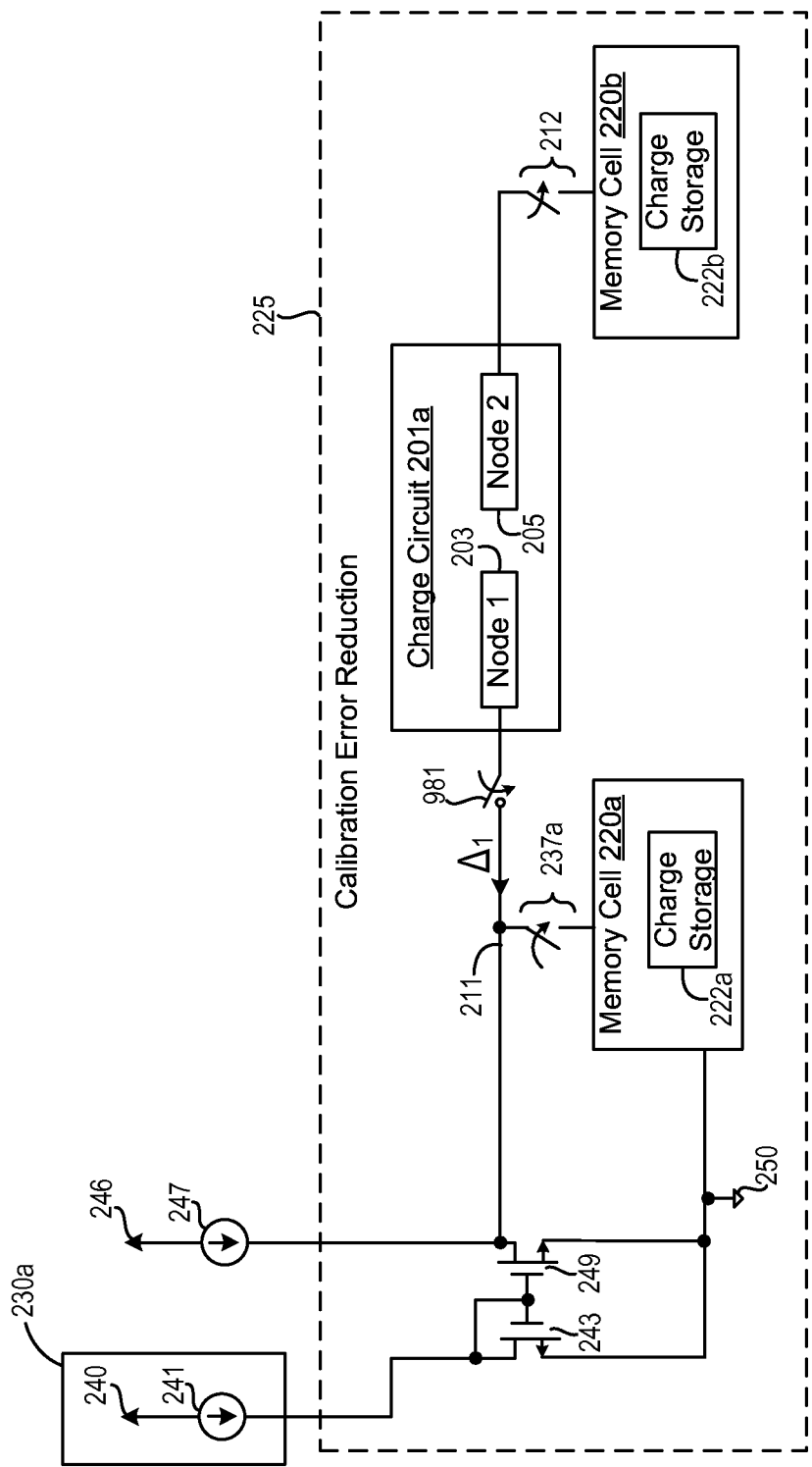
FIG. 6 is a schematic circuit diagram of the calibration error reduction circuit illustrated in FIG. 2 in a residual error sample and storage operation according to another exemplary embodiment.

With reference to FIG. 6, after calibration of current source 241 of DAC bit element 230a, residual current error ($\Delta_1$) is provided on node 211. Node 211 is connected to node 203 by closing switch 981 in one embodiment. Memory cell 220b is coupled to node 205 of circuit 201a via switch 212 and memory cell 220a is coupled to node 203 of circuit 201a via switches 237a and 981. The residual current error ($\Delta_1$) is stored in memory cell 220b along with the previously stored current $I_b$. The residual current error is used for the calibration of the next DAC bit element (e.g., DAC bit element 230b in FIG. 7) as described below.

Figure 7:
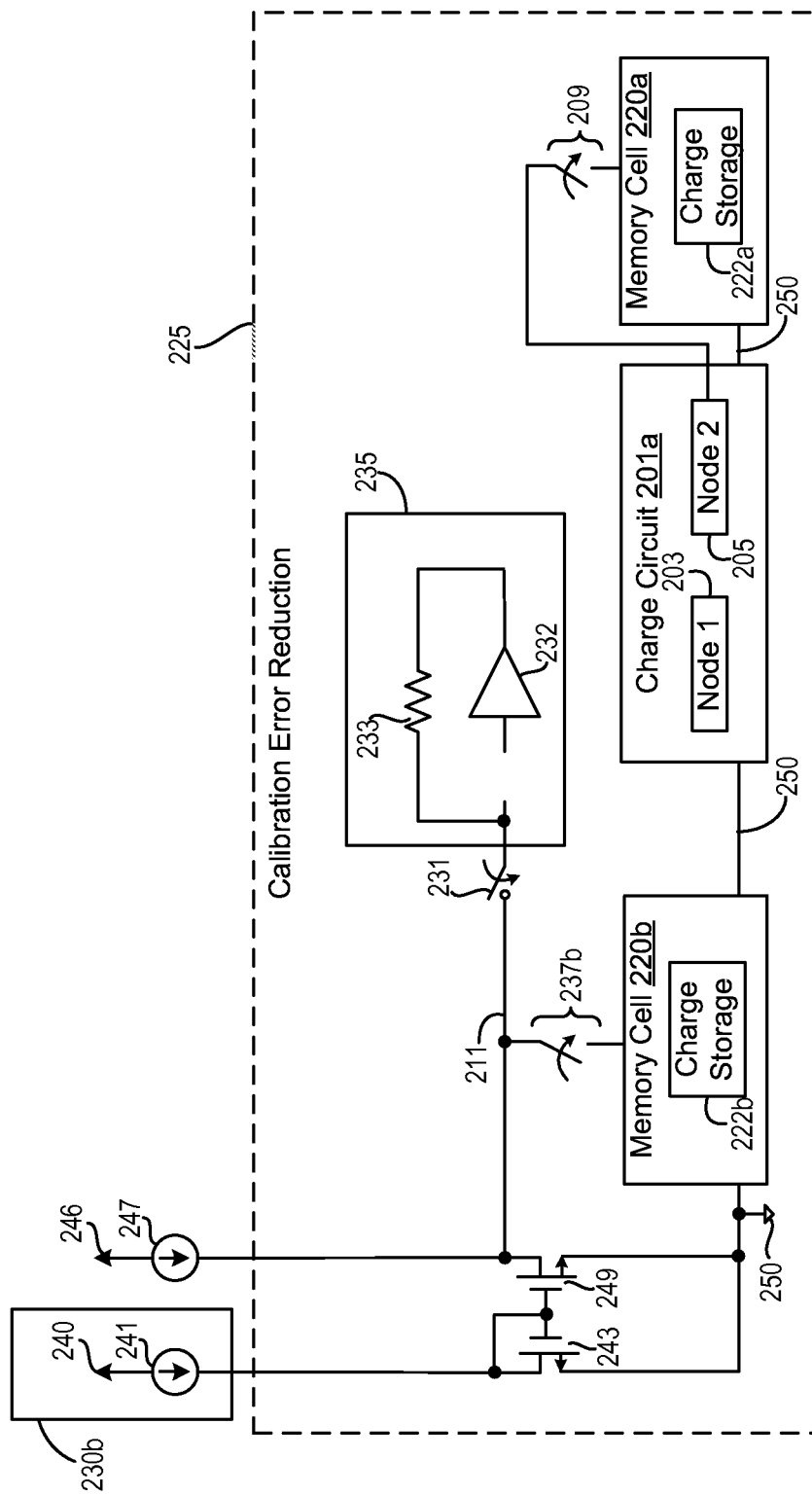
FIG. 7 is a schematic circuit diagram of the calibration error reduction circuit illustrated in FIG. 2 in a calibration operation according to another exemplary embodiment.

With reference to FIG. 7, source 241 of DAC bit element 230b can be coupled to transistor 243 and source 241 of DAC bit element 230a (FIG. 6) can be disconnected from transistor 243 during calibration of source 241 of DAC bit element 230b in one embodiment. During calibration of DAC bit element 241b, memory cell 220b is coupled to node 211 which is coupled to the input of comparator 235 and sinks current $I_b$+residual current error ($\Delta_1$) which was previously stored in cell 220b. Memory cell 220b is connected to node 211 by closing the switch 237b in one embodiment. Accordingly, memory cell 220b applies the residual current error ($\Delta_1$) from previous bit element 230a during calibration of bit element 230b. At the same time, memory cell 220a can be connected node 205 using switch 209 to store the current comparator offset current $I_b$ in a similar operation discussed above with reference to FIG. 5.

Figure 8:
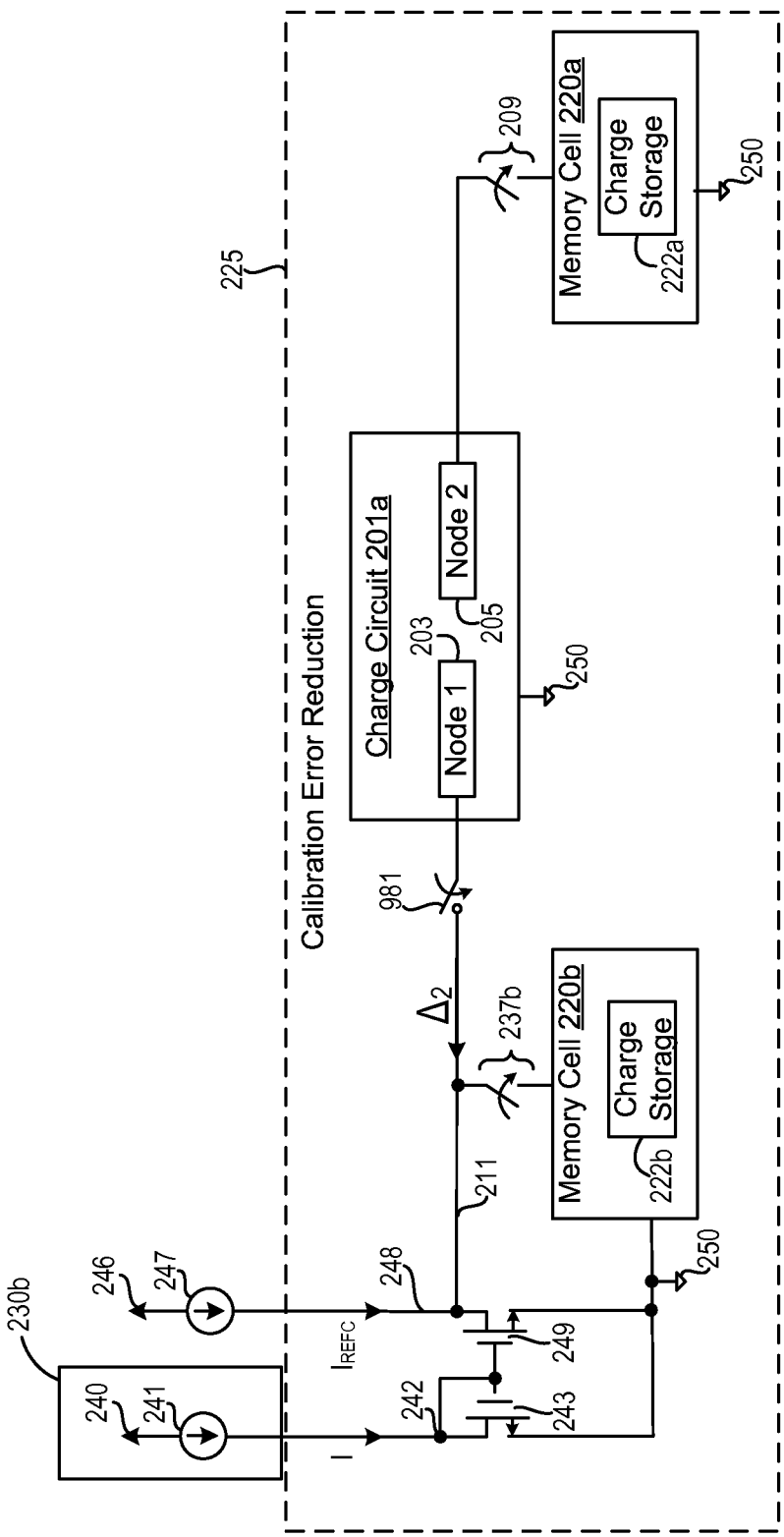
FIG. 8 is a schematic circuit diagram of the calibration error reduction circuit illustrated in FIG. 2 in a residual error sample and storage operation according to another exemplary embodiment.

With reference to FIG. 8, after calibration of source 241 of bit element 230b, the residual current error $\Delta_2$ is stored in memory cell 220a along with the previously stored current comparator offset current (current $I_b$) for use for in the calibration of the next bit element. As shown in FIG. 8, node 203 is connected to memory cell 220b and node 211 to save the current residual error current $\Delta_2$ according to one embodiment. Other MSBs or bit elements can be calibrated in the same manner until all DAC elements (e.g., MSB 64) have been calibrated. Memory cell 220b is connected to input 211 by closing the switch 237b in one embodiment.

Figure 9:
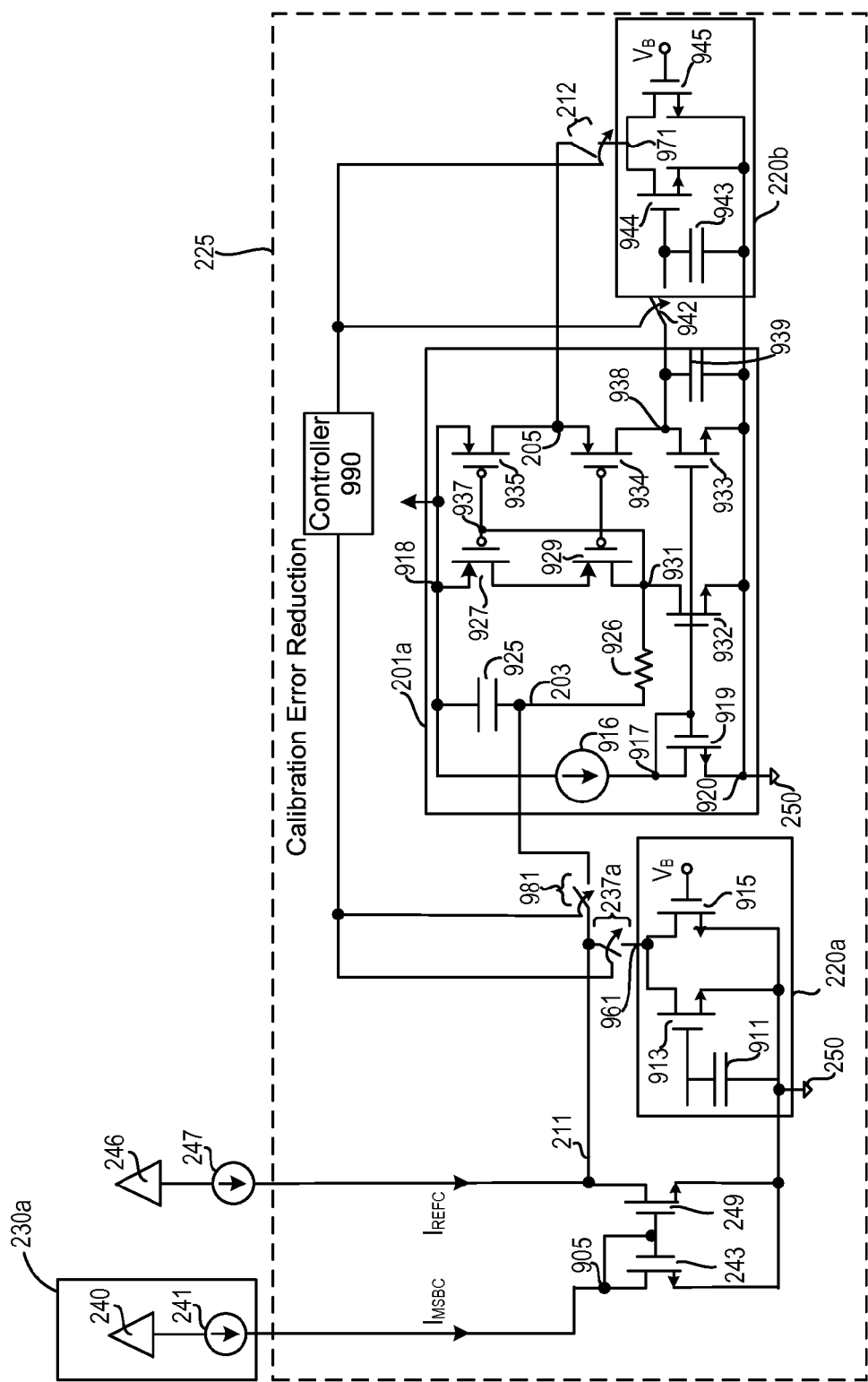
FIG. 9 is a more detailed electrical schematic circuit diagram of the calibration error reduction circuit illustrated in FIG. 2 in the residual error sample and hold operation illustrated in FIG. 6 according to another exemplary embodiment.

FIG. 9 illustrates calibration error reduction circuit in a residual error store operation similar to the operation discussed with reference to FIG. 6 according to an exemplary embodiment. In one embodiment, calibration error reduction circuit 225 (FIG. 2) can include the elements illustrated in FIG. 9.

With reference to FIG. 9, calibration error reduction circuit 225 includes controller 990, charging circuit 201a, switches 212, 942, and 981 and memory cells 220a and 220b. Charging circuit 201a includes current source 916, transistors 919, 927, 929, 932, 933, 934, and 935, capacitors 925 and 939, and a resistor 926. In one embodiment, current source 241 is connected to node 905, and current source 247 is connected to node 237.

Memory cell 220a includes a capacitor 911 and transistors 913 and 915. In one embodiment, the transistors 913 and 915 may be configured to split the current between them such that the current is divided into ⅛ and ⅞ of the total current at a node 961. The gate of transistor 915 may be set to a bias Vb that enables transistor 915 to conduct ⅞ of the total current at node 961 in one embodiment. The gate of transistor 913 is controlled so that transistor 913 to conduct approximately ⅛ the total current at node 961 in one embodiment. One terminal of capacitor 911 is connected to ground 921 and the other terminal of the capacitor 911 is connected to the gate of the transistor 913. A first terminal of transistor 913 is connected to the first terminal of the transistor 915 at node 961. The second terminals to both transistors 913 and 915 are connected to ground node 250. The controller 990 is configured to connect node 203 of the charge circuit 201a to node 961 via switches 981 and 237a. Memory cell 220a is connected to node 211 by closing switch 237a.

Memory cell 220b includes a capacitor 943, and transistors 944 and 945. In one embodiment, transistors 944 and 945 may be configured to split the current between them such that the current is divided into ⅛ and ⅞ of the total current at node 971. The gate of transistor 945 is controlled by a bias Vb to enable the transistor 945 to conduct approximately ⅞ the total current at node 971 in one embodiment. One terminal of capacitor 943 is connected to ground 921 and the other terminal of the capacitor 943 is connected to the gate of the transistor 944. A first terminal of transistor 944 is connected to the first terminal of the transistor 945 at node 971. The second terminals to both transistors 943 and 945 are connected to ground 921.

Controller 990 is configured to connect node 203 of the charge circuit 201a to node 961 (via switches 237a and 981) and to connect node 205 of charge circuit 201a to node 971 (via switch 212) to store the residual error associated with source 241 and 247 in memory cell 220b in one embodiment. Current source 916 of charge circuit 201a has a terminal that is connected to node 917 and another terminal connected to a terminal of capacitor 925, a terminal of transistor 927 and a terminal of transistor 935. Transistor 919 has a terminal that is connected to node 917 and another terminal that is connected to ground 921. A gate of the transistor 919 is connected to node 917. The gate of transistor 932 is also connected to node 917. A first terminal of transistor 932 is connected to node 931 and the second terminal of transistor 932 is connected to ground 921. The gate of transistor 933 is connected to the gate of transistor 932. A first terminal of transistor 933 is connected to node 938 and the second terminal of transistor 933 is connected to ground 921. The first terminal of transistor 934 is also connected to node 938.

Node 203 is connected to one terminal of capacitor 925 and a terminal of resistor 926. The other terminal of capacitor 925 is connected to node 918. The other terminal of resistor 926 is contended to node 931. A first terminal of transistor 927 is connected to node 918. A second terminal of transistor 927 is connected to a first terminal of transistor 929. The second terminal of transistor 929 is connected to node 931. The gate of transistor 927 is connected to node 937. The gate of transistor 929 is connected to the gate of transistor 934. The gate of transistor 935 is connected to node 937. The first terminal of transistor 935 is connected to node 918. The second terminal of transistor 935 is connected to node 205.

Controller 990 may have a plurality of control lines that control connections of nodes 203, 205 and 938 via switches 212, 237a, 942 and 981. In the residual error sample and storage operation (FIG. 6), switch 981 connects node 203 and 211, switch 237a connects node 961 to node 211, switch 212 connects node 971 to node 205 and switch 942 connects node 930 to the gate of transistor 944 in one embodiment. With such a configuration, the current residual error (e.g., $\Delta_1$) after calibration of source 241 is provided from node 203 to node 937. The provision of the current residual error from node 203 charges capacitor 939 to a level associated with the level of $I_b$+the current residual error (e.g., $\Delta_1$). Capacitor 943 is charged via switch 942 to a similar level such that capacitor 943 drives transistor 944 so that memory cell 220b sinks the current of $I_b$+the current residual error ($\Delta_1$) when connected to comparator 235 as shown in FIG. 7.

In a base current storage operation for memory 220a (FIG. 3), controller 990 disconnects node 961 from node 211, connects node 961 to node 205 via a switch (not shown in FIG. 9), and the gate of transistor 913 to node 938 via a switch (not shown). At the same time, controller 990 disconnects switch 981. Without a current residual error at node 203, capacitor 939 is charged to a level associated with current $I_b$. Accordingly, charge circuit 201a charges capacitor 911 via capacitor 939 to a level associated with the current $I_b$. This base current storage operation can be used to store base current in memory cell 220b (FIG. 5) by connecting memory cell 220b to nodes 205 and 938 in a similar manner.

In a calibration operation (e.g., FIG. 7), controller 900 connects node 971 via a switch (not shown in FIG. 9) to node 211 which is coupled to the input of current comparator 235 (not shown in FIG. 9). The gate of transistor 944 is not connected to node 938 and is isolated. With such a configuration, memory cell 220b sinks its stored current as set by capacitor 943 via transistors 944 and 945.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FAGAN) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EPSOM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASICS. The ASICS may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A nontransitory storage media may be any available media that can be accessed by a computer. By way of example, and not limitation, such nontransitory computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A digital-to-analog converter, comprising:
   a calibration circuit configured to calibrate a digital-to-analog converter (DAC) element using a residual error from a previously calibrated digital-to-analog converter (DAC) element; and
   a calibration error reduction circuit comprising a first memory cell, wherein the residual error is a first residual current error and is at least temporarily stored in the first memory cell, wherein the calibration error reduction circuit further comprises a second memory cell, the second memory cell being configured to store a second residual current error from the DAC element calibrated using the residual error from the previously calibrated DAC element.

2. The converter of claim 1, wherein the calibration error reduction circuit further comprises a charging circuit selectively couplable to the first and second memory cells.

3. The converter of claim 1, wherein the second memory cell is a current source memory.

4. The converter of claim 3, wherein the first memory cell includes a capacitor for storing an electric charge associated with the residual error.

5. A digital-to-analog converter, comprising:
   a calibration circuit configured to calibrate a digital-to-analog converter (DAC) element using a residual error from a previously calibrated digital-to-analog converter (DAC) element; and
   a calibration error reduction circuit comprising a first memory cell, wherein the residual error is a first residual current error and is at least temporarily stored in the first memory cell,
   wherein the calibration error reduction circuit further comprises a charge circuit for storing the residual error in the first memory cell.

6. A method of calibrating a multi-element circuit, the method comprising:
   storing a first residual error based on a difference between a reference current and a first calibrated current associated with a first element; and
   comparing the reference current and a second calibrated current associated with a second element using the first residual error.

7. The method of claim 6, further comprising:
   storing a second residual error based on a comparison of the reference current and the second calibrated current associated with the second element; and
   providing the first residual error from a first memory circuit during the comparing step.

8. The method of claim 7, further comprising:
   comparing the reference current and a third calibrated current associated with a third element using the second residual error.

9. The method of claim 8, further comprising:
   providing the second residual error from a second memory circuit during the second comparing step.

10. The method of claim 8, further comprising:
    storing a third residual error associated with a comparison of the reference current and the third calibrated current associated with the third element.

11. The method of claim 10, wherein the third residual error is stored in the first memory circuit.

12. The method of claim 10, wherein a charging circuit effects the storing steps, wherein the charging circuit stores a comparator offset current in the first and second memory circuits.

13. An apparatus, comprising:
means for providing a reference current;
means for providing a first calibrated current in response to a comparison of the reference current and the first calibrated current;
means for storing a first residual error associated with the first calibrated current;
means for providing a second calibrated current in response to a comparison of the reference current and the second calibrated current, the means for providing the second calibrated current using the first residual error; and
means for storing a second residual error associated with the second calibrated current, wherein both means for storing store a comparator offset current.

14. An apparatus, comprising:
means for providing a reference current;
means for providing a first calibrated current in response to a comparison of the reference current and the first calibrated current;
means for storing a first residual error associated with the first calibrated current;
means for providing a second calibrated current in response to a comparison of the reference current and the second calibrated current, the means for providing the second calibrated current using the first residual error; and
means for storing a second residual error associated with the second calibrated current, wherein both means for storing include a current storage circuit.

15. A circuit, comprising:
a plurality of digital-to-analog conversion bit elements, each bit element comprising a calibrated current source; and
a calibration error reduction circuit comprising a first memory circuit, wherein the first memory circuit stores a first residual error associated with a first calibrated current from one of the digital-to-analog conversion bit elements and the first residual error is used to provide a second calibrated current from another of the digital-to-analog conversion bit elements, wherein the calibration error reduction circuit comprises a second memory circuit and stores a second residual error based on a comparison of a reference current and the second calibrated current, wherein the first memory circuit stores a third residual error associated with a third calibrated current from a further of the digital-to-analog conversion bit elements, wherein the second residual error is used to provide the third calibrated current.

16. The circuit of claim 15, wherein the second memory circuit stores a fourth residual error associated with a fourth calibrated current from still another of the digital-to-analog conversion bit elements, wherein the third residual error is used to provide the fourth calibrated current.

17. The circuit of claim 16, wherein integrated nonlinearities associated with calibration errors are reduced by a factor of 2.

18. The circuit of claim 15, wherein the first and second memory circuits are current memory circuits.

* * * * *